（12）United States Patent
Franz et al.

(10) Patent No.: US 11,662,126 B2
(45) Date of Patent: May 30, 2023

(54) LEAK MITIGATION SYSTEM

(71) Applicant: HEWLETT PACKARD ENTERPRISE DEVELOPMENT LP, Houston, TX (US)

(72) Inventors: John Franz, Houston, TX (US); Harvey J. Lunsman, Chippewa Falls, WI (US); Benjamin Kufahl, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 170 days.

(21) Appl. No.: 17/350,493

(22) Filed: Jun. 17, 2021

(65) Prior Publication Data

US 2022/0404079 A1    Dec. 22, 2022

(51) Int. Cl.
| | |
|---|---|
| *F25B 45/00* | (2006.01) |
| *H05K 7/20* | (2006.01) |
| *F25B 41/24* | (2021.01) |
| *F25B 41/31* | (2021.01) |
| *F25B 49/00* | (2006.01) |

(52) U.S. Cl.
CPC .............. *F25B 45/00* (2013.01); *F25B 41/24* (2021.01); *F25B 41/31* (2021.01); *F25B 49/005* (2013.01); *H05K 7/20272* (2013.01); *F25B 2345/002* (2013.01); *F25B 2345/003* (2013.01); *F25B 2500/222* (2013.01); *F25B 2600/2513* (2013.01)

(58) Field of Classification Search
CPC .......... F25B 45/00; F25B 41/24; F25B 41/31; F25B 49/005; F25B 2345/002; F25B 2345/003; F25B 2500/222; F25B 2600/2513; H05K 7/20272
See application file for complete search history.

(56) References Cited

U.S. PATENT DOCUMENTS

| | | | |
|---|---|---|---|
| 4,293,385 | A | 10/1981 | Brachet |
| 5,309,487 | A | 5/1994 | McDermott et al. |
| 9,007,221 | B2 | 4/2015 | Zeighami et al. |
| 9,773,574 | B2 | 9/2017 | Peterson |
| 10,582,641 | B2 | 3/2020 | Harrington |
| 2010/0027731 | A1 | 2/2010 | Wood et al. |

(Continued)

FOREIGN PATENT DOCUMENTS

| | | | |
|---|---|---|---|
| CN | 106766297 A | * | 5/2017 |
| GB | 1507688 A | | 4/1978 |

(Continued)

*Primary Examiner* — Kun Kai Ma
(74) *Attorney, Agent, or Firm* — Hewlett Packard Enterprise Patent Department

(57) ABSTRACT

Example implementations relate to a leak mitigation (LM) system. The LM system may include a collection tank, a first valve unit coupled to the collection tank, a second valve unit coupled to a cooling loop carrying a coolant, and an LM pump coupled between the first valve unit and the second valve unit. Moreover, the leak mitigation system may also include a controller operatively coupled to the first valve unit, the second valve unit, and the LM pump to operate, in an event of a leak of the coolant from the cooling loop, the first valve unit, the second valve unit, and the LM pump to transfer at least a portion of the coolant to the collection tank from the cooling loop via the second valve unit and the first valve unit.

20 Claims, 5 Drawing Sheets

(56) References Cited

U.S. PATENT DOCUMENTS

| | | | |
|---|---|---|---|
| 2020/0093033 A1 | | 3/2020 | Lunsman et al. |
| 2020/0240869 A1 | | 7/2020 | Yesh et al. |
| 2021/0389028 A1 | * | 12/2021 | Smith .................... F25B 49/02 |

FOREIGN PATENT DOCUMENTS

| | | | | |
|---|---|---|---|---|
| GB | 1507689 | A | | 4/1978 |
| JP | 2016015398 | A | * | 1/2016 |
| JP | 2017141873 | A | * | 8/2017 |
| WO | WO-2011106027 | A1 | | 9/2011 |
| WO | WO-2021248289 | A1 | * | 12/2021 |

* cited by examiner

LEAK MITIGATION SYSTEM

BACKGROUND

Electronic components (e.g., processing and memory components) included in computing devices, such as servers, may generate heat during their operation. To prevent damage to the electronic components, cooling systems have been used in many computing devices to maintain the electronic components at acceptable operational temperatures. Generally, such cooling systems may utilize a cooling fluid to absorb thermal energy from the electronic components generating heat. In some instances, the cooling fluid may be a gas, such as air, and may directly contact the electronic component(s) to transfer the heat away from the electronic component(s). In other instances, the cooling fluid may be a liquid, such as water or oil, which may be brought into thermal contact with the electronic component(s) via one or more cooling blocks or piping.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Figure 1:
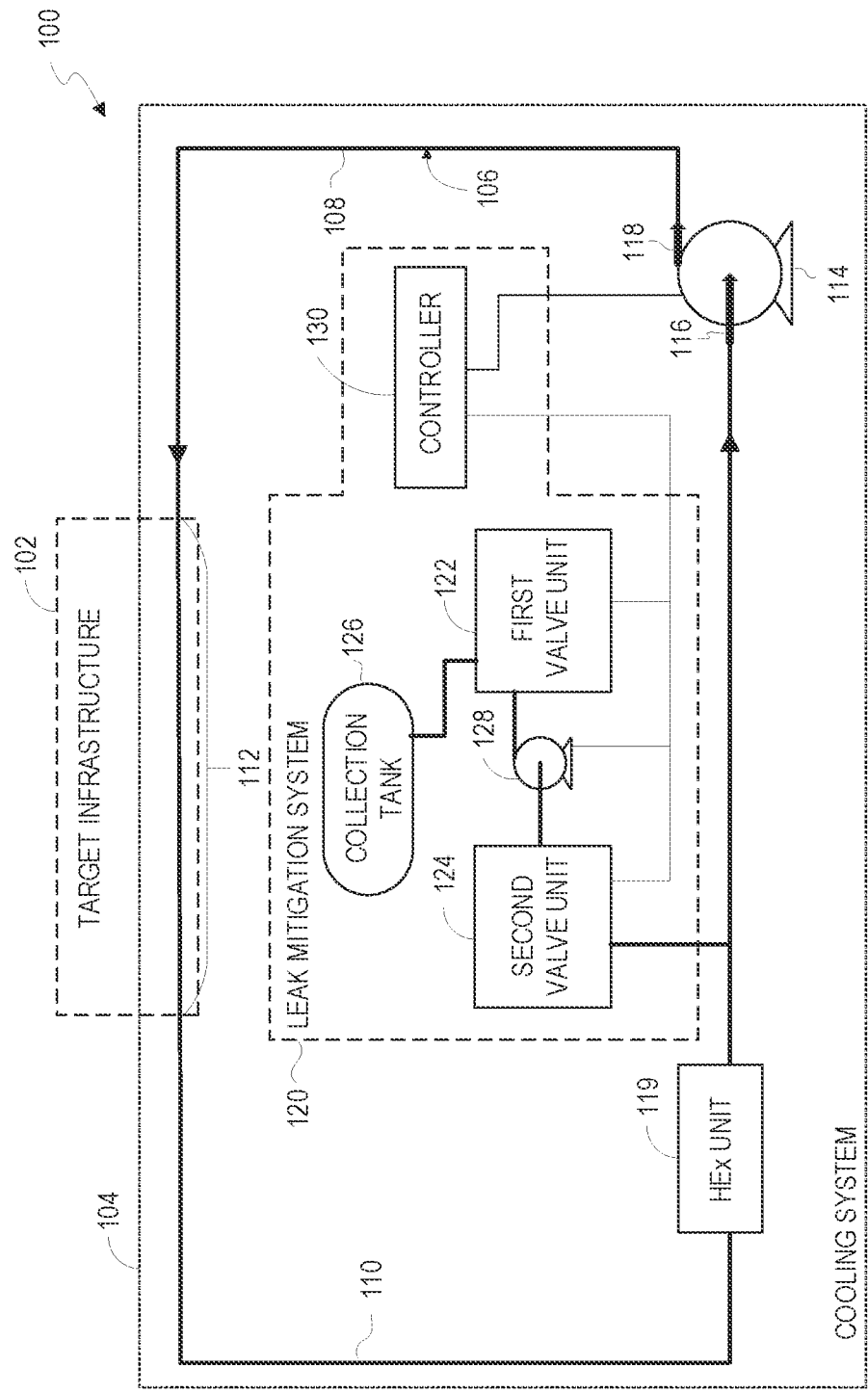
FIG. 1 is a block diagram of a system including a cooling system, in accordance with an example.

It is emphasized that, in the drawings, various features are not drawn to scale. In fact, in the drawings, the dimensions of the various features may be arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a" "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, or communicatively linked through a communication channel, pathway, network, or system. Further, the term "and/or" as used herein refers to and encompasses any and all possible combinations of the associated listed items. It will also be understood that, although the terms first, second, etc., may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to.

As electronics devices such as central processing units (CPUs), graphical processing units (GPUs), and other electronic components (e.g.; memory devices) decrease in size, computing devices, such as servers, are in turn able to increase the number of such electronic components utilized. Likewise, server racks, such as high-density server racks, have been constructed to house an increased number of servers for certain computing applications, Air-cooling systems, such as computer room air conditioner units, typically are not able to provide sufficient cooling airflow through such high-density server racks. In addition, generating increased airflow via a forced-air method may lead to excessive energy consumption by the fans and/or compressors generating the forced air, Therefore, liquid cooling may be implemented in such environments due to the better heat absorption property of liquid coolants.

In one implementation, liquid cooling may be carried out by using piping containing a liquid coolant. Such piping may be disposed in thermal contact with the electronic components to be cooled. The piping may be disposed in thermal contact with cold plates or heat sinks which in turn are thermally coupled to the electronic components. The piping may further interconnect a multitude of components to form a closed cooling loop. An example closed cooling loop may include a pump to circulate a liquid coolant through one or more server racks to absorb heat generated by the electronic components contained in a plurality of computing devices (e.g., servers) housed in one or more chassis or like enclosures installed in the server racks. The closed cooling loop may further include a heat exchanger to transfer the heat absorbed by the liquid coolant to an external cooling facility.

Although liquid cooling utilizing the closed cooling loop is effective for cooling electronic components in a variety of server implementations, a compromise or breach of the closed cooling loop may result in a leakage of the liquid coolant from the closed cooling loop. In such cases, internal pressure in the closed cooling loop may drive the liquid coolant from the closed cooling loop to the surrounding environment. Generally, the leakage of the liquid coolant, if not remedied, will continue until a pressure differential no longer exists between the liquid coolant inside the closed cooling loop and the external atmosphere. In a surrounding environment including electrical equipment or other equipment susceptible to damage from the liquid coolant, a prolonged leakage of the liquid coolant may result in the damage or destruction of such equipment and considerable expense to repair and replace the equipment.

Accordingly, some implementations have been established in the art to mitigate leaks in closed cooling loops. In one example implementation to address the leak of liquid coolant from the closed cooling loop, valves are placed at the inlet of the piping to each server rack or at each enclosure or chassis in each server rack. Thus, when a leak is detected in a particular chassis or server rack, the respective valve permitting the flow of the liquid coolant into such chassis or server rack is closed, thereby preventing the flow of additional liquid coolant to the leak and isolating the leak from the remainder of the closed cooling loop. Although such use of the valves may mitigate the leakage of the liquid coolant from the closed cooling loop, certain drawbacks are apparent from such implementation. For instance, the valves and their associated actuators positioned at the inlet of the piping to each server rack or at each enclosure or chassis in each server rack may occupy a large amount of physical space, thereby eliminating such space for other useful components. In addition, the number of inputs and outputs associated with the valves and actuators to control each valve and actuator adds to the complexity of such an implementation.

In another implementation addressing a leakage of liquid coolant from a closed cooling loop, portions of the closed cooling loop are maintained at a pressure less than atmospheric pressure (i.e., a partial vacuum), such that any leak developing in the portions of the closed cooling loop at a partial vacuum pressure would draw air into the closed cooling loop instead of driving liquid coolant out of the closed cooling loop. However, such an implementation may be ineffective for portions of the closed cooling loop that are not maintained at a partial vacuum. In addition, the equipment provided for maintaining portions of the closed cooling loop at a partial vacuum introduces cost and complexity into the closed cooling loop.

In yet another implementation, a vacuum pump is used on the cooling loop to prevent leaks and entrain air. While this implementation works at reducing leaks, there are a variety of problems experienced. For instance, the vacuum pump needs to be running continuously to establish and maintain the vacuum. Such continuous operation of the vacuum pump consumes more power. Also, the continuous operation of the vacuum pump may cause reliability issues. Furthermore, the cooling loop and an expansion tank disposed in the cooling system operating constantly under vacuum may result in a more complex controls program. Moreover, for the vacuum pump to operate effectively, a large air vessel may be required in the cooling system. An exposure of a coolant to a large air pocket of the vessel may cause chemistry control problems.

In accordance with aspects of the present disclosure, a leak mitigation (LM) system for a cooling system is presented that may overcome one or more of the challenges noted hereinabove. The LM system presented herein may include a collection tank, a first valve unit coupled to the collection tank, and a second valve unit coupled to a cooling loop carrying a coolant. Further, the LM system may include an LM pump coupled between the first valve unit and the second valve unit. Moreover, the LM system may include a controller operatively coupled to the first valve unit, the second valve unit, and the LM pump to operate, in an event of a leak of the coolant from the cooling loop, the first valve unit, the second valve unit, and the LM pump to transfer at least a portion of the coolant to the collection tank from the cooling loop via the second valve unit and the first valve unit. The transfer of some of the coolant from the cooling loop may reduce the pressure of the coolant remaining inside the cooling loop to slightly below atmospheric pressure, which prevents additional liquid from leaving the cooling loop via the leak.

Further, the cooling loop may include a coolant circulation pump to circulate the coolant through the cooling loop. Additionally, in some examples, the cooling system may also include an expansion tank coupled to the cooling loop via the second valve unit to maintain the coolant at a predetermined pressure inside the cooling loop when there is no leakage of the coolant from the cooling loop. In some examples, in response to detection of the leak, the controller may also suspend the operation (i.e., shutdown) of the coolant circulation pump. Moreover, in some instances, upon detection of the leakage of the coolant, the controller may also isolate the expansion tank from the cooling loop. These additional acts of shutting down the coolant circulation pump and isolating the expansion tank may reduce any positive pressure on the coolant in the cooling loop thereby further enhancing the effectiveness of leak mitigation by the presently contemplated examples.

The use of the LM pump to transfer at least a portion of the coolant from the cooling loop to the collection tank may reduce or mitigate the leakage of the coolant at the location of the leak. This is achieved due to the transfer of the coolant away from the cooling loop caused by a suction force created by the LM pump. Moreover, shutting down the coolant circulation pump and isolating the expansion tank may further enhance the effectiveness of leak mitigation in presently contemplated examples. In particular, in the proposed examples, the LM pump may be operated momentarily, in the event of the leakage to suck the coolant from the cooling loop and transfer it to the collection tank. This is in contrast to the known approaches of keeping a cooling loop constantly at partial vacuum which might require constant pumping. In the present case, as there is no need to maintain the cooling loop at a partial vacuum, a much simpler cooling loop can be designed in comparison to known approaches requiring a cooling loop at a constant partial vacuum. Therefore, the LM system, in accordance with aspects described herein, may aid in efficiently mitigating the leak of the coolant.

Referring now to the figures, in FIG. 1, a block diagram of a system 100 including a target infrastructure 102 and a cooling system 104 is depicted, in accordance with one example of the present disclosure. In some implementations, the cooling system 104 may be a liquid cooling system and utilized to cool the heat-generating components (not shown) in the target infrastructure 102.

The target infrastructure 102 may include one or more devices, for example, computing devices (not shown in FIG. 1, see FIG. 2) such as servers and/or electronic storage devices. The computing devices such as server blades may be disposed in one or more server chassis (not shown) mountable on a server rack (not shown). By way of example, the server chassis may be mounted on the server rack in a stacked arrangement, where a plurality of server chassis may be stacked above and below one another. The server rack may be included in a datacenter (not shown). Other examples of the computing devices may also include network devices such as, but not limited to, routers, switches, wireless communication devices/access points, wireless range extenders, repeaters, protocol converters, firewall devices, network gateways, network address translators, multiplexers, network interface controllers, wireless network interface controllers, ISDN terminal adapters, and other related hardware. The computing devices in the target infrastructure 102 may include heat-generating components. The term "heat-generating component" as used herein may refer to an electronic component that generates heat during its operation. Non-limiting examples of the heat-generating component may include IC chips (e.g., ASIC chips, FPGA chips, processor chips, memory chips, or any other type of IC chips), CPUs, GPUs, and memory devices, such as dual in-line memory modules (DIMMs), power supply chips or modules, electronic devices such as capacitors, inductors, resistors, or optical converters, such as, active optical cables (AOC) or vertical-cavity surface-emitting laser (VCSEL).

In some examples, the cooling system 104 may be used to cool the heat-generating components of the computing devices in the target infrastructure 102. The cooling system 104 may include a cooling loop 106, a heat exchange unit 119, and a leak mitigation (LM) system 120. A liquid coolant may be circulated inside the cooling loop 106 to absorb heat from the heat-generating components in the target infrastructure 102. The cooling loop 106 may include a supply line 108, a return line 110, a cooling section 112, and a coolant circulation pump 114. The coolant circulation pump 114 and the heat exchange unit 119 may be disposed along the cooling loop 106. Further, the reference numerals 116 and 118 respectively represent an inlet and an outlet of the coolant circulation pump 114. The inlet 116 and the outlet 118 are hereinafter referred to as a pump inlet 116 and a pump outlet 118.

The cooling section 112 of the cooling loop 106 may be disposed in thermal contact with the computing devices in the target infrastructure 102 to facilitate a flow of a liquid coolant (hereinafter referred to as a coolant) to cool one or more heat-generating components of the computing devices. Further, the term "disposed in thermal contact" may refer to positioning two components in direct or indirect contact with each other such that heat can flow from one component to another component. In some examples, the coolant may include water. In some examples, the coolant may include a mixture of water and chemical treatment additives, such as corrosion inhibitors. In certain other implementations, the coolant may be a mixture of water and glycol to prevent freezing of the coolant. The coolant may also be a mixture of water, glycol, and corrosion inhibitors. By way of example, the coolant may be a propylene-glycol water (PGW) mixture, such as, PGW 25%. In some examples, the cooling section 112 may include one or more tubes that may be disposed in thermal contact with cold plates or heat sinks which in turn are thermally coupled to the heat-generating components of the computing devices in the target infrastructure 102. In one or more implementations, an integrated heat spreader (not shown) may transfer heat from an electronic component mounted to the printed circuit board to a respective cold plate or heat sink from which the heat may be transferred to the coolant contained in the cooling section 112. In some implementations, the target infrastructure 102 may include one or more racks or enclosures holding computing devices and at least a portion of the cooling section 112 may be disposed in each rack of the target infrastructure 102. It may be noted that the present disclosure is not limited with respect to any particular arrangement of the tubes of the cooling section 112 in the target infrastructure 102 and the types of coolants that can be used.

The coolant circulation pump 114 may facilitate the circulation of the coolant inside the cooling loop 106. The coolant circulation pump 114 may be operated by a drive (not shown). The drive may include a fixed-speed motor or a variable-speed motor. In some implementations, the drive may be a variable-speed drive (VSD). The coolant circulation pump 114 may draw the coolant from the pump inlet 116 at an inlet pressure and may discharge the coolant from the pump outlet 118 at an outlet pressure that is greater than the inlet pressure. By way of example, the inlet pressure may be about 14.7 psi (1 atm or 102.3 kPa) and the outlet pressure may be about 40 psi (2.72 atm or 275.8 kPa). Accordingly, the pressure in the cooling loop 106 may be the greatest at the pump outlet 118, and the pressure in the cooling loop 106 may be at a minimum at the pump inlet 116 during a standard operation of the cooling system 104. In one or more implementations, a filter (not shown) may be fluidly coupled to the pump outlet 118 to remove particulates from the coolant discharged from the pump outlet 118.

The pump outlet 118 may be fluidly coupled to the supply line 108 that supplies the coolant to the cooling section 112 disposed in the target infrastructure 102. The term "fluidly coupled" or "fluid coupling" may be referred to as a coupling through which a fluid can be passed. Further, the return line 110 may fluidly couple the cooling section 112 with the pump inlet 116 directly or via additional elements (for example, a heat exchange unit 119, described later). During operation, the coolant may be supplied to the cooling section 112 from the pump outlet 118 via the supply line 108. When the coolant flows via the cooling section 112, the coolant may absorb heat from the respective computing devices disposed in the target infrastructure 102. The heated coolant may then be supplied to the return line 110 from which the coolant flows to the pump inlet 116 via the heat exchange unit 119. The heat exchange unit 119 (marked as "HEx UNIT" in FIG. 1) may absorb heat from the heated coolant and reduce the temperature of the coolant. In some examples, the heat exchange unit 119 may include a liquid-to-air heat exchanger which may transfer the heat from the coolant to gas such as air. In certain other examples, the heat exchange unit 119 may include a liquid-to-liquid heat exchanger which may transfer the heat from the coolant to a liquid coolant similar or different from the coolant circulating inside the cooling loop 106.

It is apparent that any compromise or breach of a cooling loop in traditional systems may result in a leakage of the coolant. However, in accordance with various examples described herein, the cooling system 104 includes the LM system 120 to prevent spillage of the coolant from the cooling loop 106. The LM system 120 may include a first valve unit 122, a second valve unit 124, a collection tank 126, an LM pump 128, and a controller 130. The collection tank 126 may be representative of an enclosure or a vessel (open or closed) of any design or shape. Further, the first valve unit 122 and/or the second valve unit 124 may include an arrangement of one or more valves capable of controlling the flow of fluid therethrough. In some examples, the first valve unit 122 and/or the second valve unit 124 may be electronically controlled. The first valve unit 122 may be coupled to the collection tank 126. Further, the second valve unit 124 may be coupled to the cooling loop 106. The LM pump 128 may be coupled between the first valve unit 122 and the second valve unit 124. The coupling between the first valve unit 122, the second valve unit 124, the collection tank 126, and the LM pump 128 as depicted in FIG. 1 may be done via piping capable of allowing passage of fluid therethrough.

The controller 130 may be operatively coupled to one or more components of the cooling system 104, for example, the coolant circulation pump 114, the first valve unit 122, the second valve unit 124, and the LM pump 128. In some examples, the controller 130 may be operatively coupled to control terminals of the first valve unit 122 and the second valve unit 124. Further, in some examples, the controller 130 may be operatively coupled to the coolant circulation pump 114 and the LM pump 128 via a respective electronic switch through which supply of electric power to the coolant circulation pump 114 and the LM pump 128 may be controlled. The term "operatively coupled" may refer to a connection between the controller 130 and the components of the cooling system 104 using which the controller 130 may send control signals to the components of the cooling system 104 or receive status/data information from the components of the cooling system 104. The controller 130 may be operatively coupled to the coolant circulation pump 114 and the first valve unit 122 via a wired connection as shown in FIG. 1 or via a wireless connection (not shown). In some implementations, the wireless connection may be effected via a network or personal communication links (e.g., communication links enabled via Bluetooth, infrared, and or radio communication techniques). The network may be a private network or a public network, such as the Internet, intranet, and/or cellular communication network.

The controller 130 may be implemented using hardware devices, for example, a microcontroller, a microprocessor, central processing unit core(s), application-specific integrated circuit (ASIC), a field-programmable gate array (FPGA), etc., to implement various functionalities described herein. The controller 130 may also include any combination of such hardware devices and programming (e.g., instructions stored in a machine-readable medium) to implement various functionalities described herein. The machine-readable medium may be a non-transitory storage medium, examples of which may include, but are not limited to, a random access memory (RAM), a read-only memory (ROM), an electrically erasable programmable read-only memory (EEPROM), a flash memory, a hard disk drive, etc. The controller 130 may execute instructions (i.e., programming or software code) stored on the machine-readable medium. Additionally or alternatively, the controller 130 may include electronic circuitry for performing various functionalities described herein.

During operation of the cooling system 104, the controller 130 may detect a leak of the coolant from the cooling loop 106 based on parameters including, but not limited to, pressure, flow rate, temperature, and/or conductivity of the coolant in the cooling loop 106. The controller 130 may monitor such parameters via one or more sensors/transducers (not shown in FIG. 1 see FIG. 2) and determine an existence of the leak of the coolant based on measured values of on one or more of the pressure, flow rate, temperature, and/or conductivity of the coolant in the cooling loop 106. It may be noted that the present disclosure is not limited with respect to techniques or methods for detecting the leak. Any suitable type of technique or method may be implemented to detect the leak of the coolant.

Further, in response to detection of the leak, the controller 130 may operate the first valve unit 122, the second valve unit 124, and the LM pump 128 to establish a fluid coupling between the collection tank 126 and the cooling loop 106. The suction force created by the LM pump 128 may cause the transfer of at least a portion of the coolant from the cooling loop 106 to the collection tank 126. Such transfer of the coolant from the cooling loop 106 to the collection tank 126 may reduce or eliminate an outflow of the coolant from the cooling loop 106 at the location of the leak. Further, in some examples, the controller 130, in response to detection of the leak, may also suspend the operation of the coolant circulation pump 114 by disabling the supply of power to the coolant circulation pump 114. The shutting down of the coolant circulation pump 114 may reduce any positive pressure on the coolant in the cooling loop 106 thereby further enhancing the effectiveness of leak mitigation by presently contemplated examples.

Figure 2:
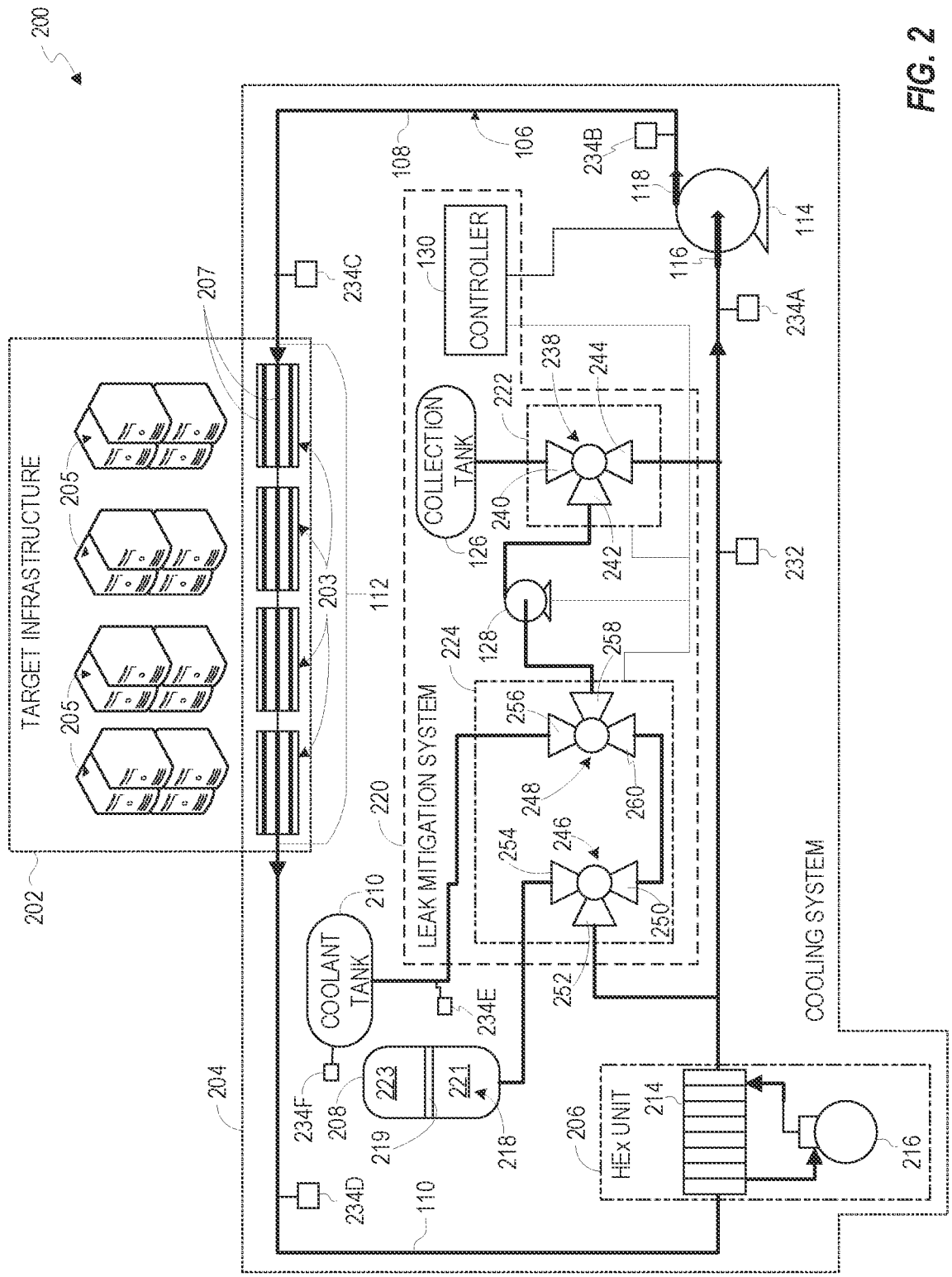
FIG. 2 is a block diagram of a system including a cooling system, in accordance with another example.

Referring now to FIG. 2, a block diagram of a system 200 including a target infrastructure 202 and a cooling system 204 is depicted, in accordance with another example of the present disclosure. The system 200 of FIG. 2 may represent one example of the system 100 of FIG. 1 and include several blocks or components which are similar to the blocks or components already described in FIG. 1, description of which is not repeated herein.

As shown in FIG. 2, the system 200 includes the target infrastructure 202 and the cooling system 204 disposed in thermal contact with the target infrastructure 202 to cool the computing devices 205. The target infrastructure 202 depicted in FIG. 2 may be an example of the target infrastructure 102 of FIG. 1, In some examples, the target infrastructure 202 may include one or more devices, for example, computing devices 205 such as servers and/or electronic storage devices. Other examples of the computing devices may also include network devices such as, but not limited to, routers, switches, wireless communication devices/access points, wireless range extenders, repeaters, protocol converters, firewall devices, network gateways, network address translators, multiplexers, network interface controllers, wireless network interface controllers, ISDN terminal adapters, and other related hardware. The computing devices 205 may be disposed in one or more racks. The computing devices 205 in the target infrastructure 202 may include heat-generating components. The cooling system 204 may be used to cool the heat-generating of one or more computing devices 205.

The cooling system 204 may be one implementation example of the cooling system 104 shown in FIG. 1, The cooling system 204 may also include the cooling loop 106 including the supply line 108, the cooling section 112, the return line 110, and the coolant circulation pump 114 connected in a similar fashion as depicted in FIG. 1. Further, the cooling system 204 may include a heat exchange unit 206 (marked as "HEx UNIT" in FIG. 2), an expansion tank 208, and a coolant tank 210. Further, the cooling system 204 of FIG. 2 may also include an LM system 220 which is representative of one example of the LM system 120 of FIG. 1. The LM system 220 may include a first valve unit 222, a second valve unit 224, and an LM pump 128 that are representative of examples of the first valve unit 122, the second valve unit 124, and the LM pump 128, respectively. Further, the LM system 220 may also include the controller 130 operatively coupled to the first valve unit 222, the second valve unit 224, and the LM pump 128 to control operations thereof.

In the example implementation of the cooling system 204 depicted in FIG. 2, the cooling section 112 may include a plurality of cooling networks 203 each comprising one or more tubes 207. The cooling networks 203 may be disposed in thermal contact with the computing devices 205 in the target infrastructure 202 to facilitate a flow of the coolant to cool one or more computing devices 205, in particular, the heat-generating components. In one or more implementations, an integrated heat spreader (not shown) may transfer heat from an electronic component mounted to the printed circuit board to a respective cold plate or heat sink from which the heat may be transferred to the coolant contained in the tubes 207. In some implementations, a cooling network 203 may be disposed in each rack of the target infrastructure 202, It may be noted that the present disclosure is not limited with respect to any particular arrangement of the tubes 207 in the cooling networks 203 and the arrangement the cooling networks 203 in the target infrastructure 202.

The heat exchange unit 206 may be representative of an example of the heat exchange unit 119 of FIG. 1 and is disposed along the cooling loop 106. The heat exchange unit 206 may include a heat exchanger 214. The heat exchanger 214 may be disposed along the cooling loop 106 in a location downstream of the target infrastructure 202 and upstream of the coolant circulation pump 114, as depicted in FIG. 2, In other words, the heat exchanger 214 may be disposed along the return line 110. In one example, the heat exchanger 214 may be disposed in thermal contact with the return line 110. Alternatively, in another example, the heat exchanger 214 may be fluidly coupled along the return line 110, thereby allowing passage of the heated coolant therethrough. The heat exchanger 214 may aid in removing thermal energy (i.e., heat) from the coolant flowing in the cooling loop 106. In one example, the heat exchanger 214 may be a liquid-to-air heat exchanger which may transfer the heat from the coolant to gas such as air. The heat exchange unit 206 may further include a cooling apparatus 216 that may be disposed in fluid communication (i.e., fluidly coupled) with the heat exchanger 214. The cooling apparatus 216 supplies a cooling fluid to the heat exchanger 214. The cooling fluid may absorb heat from the coolant flowing through the heat exchanger 214. If the heat exchanger 214 is a liquid-to-air heat exchanger, the cooling fluid may be air. In some other examples, the heat exchanger 214 may be a liquid-to-liquid heat exchanger such as, but not limited to, a brazed plate heat exchanger or an open frame heat exchanger. In such implementation, the cooling fluid may be a liquid, such as water.

The expansion tank 208 may include may define a chamber 218 and includes a diaphragm 219 disposed in the chamber 218. The diaphragm 219 may be formed from a flexible material such as rubber, for example. The diaphragm 219 separates the chamber 218 into a gas-filled section 223 and a liquid-filled section 221. In one or more implementations, the gas-filled section 223 may be charged with a gas (such as air) at an initial pressure in the gas-filled section 223 that is equal to the predetermined pressure (for example, about at or above atmospheric pressure) while the expansion tank 208 is fluidly coupled to the cooling loop 106. The expansion tank 208 may maintain the inlet pressure of the coolant circulation pump 114 at a predetermined pressure during normal operation (i.e., when no leak of the coolant is detected by the LM system 220) of the cooling system 204. Maintaining the inlet pressure at the predetermined pressure may be advantageous for preventing cavitation of the coolant circulation pump 114 and the resulting damage to internal components (e.g., impeller blades) of the coolant circulation pump 114. The phrase "maintaining the inlet pressure at (or near) the predetermined pressure" should be understood to mean that the expansion tank 208 tends to offset or absorb pressure changes at the pump inlet 116, but not that the expansion tank 208 necessarily perfectly maintains the inlet pressure at a fixed pressure. In other words, it may be possible for conditions to cause the inlet pressure to move away from the predetermined pressure, despite the expansion tank 208, but the presence of the expansion tank 208 reduces the magnitude of the change in inlet pressure.

Further, in some examples, in conjunction with the expansion tank 208, the cooling system 204 may include the coolant tank 210. The coolant tank 210 may be coupled to the cooling loop 106 via the LM system 220 to maintain a predetermined quantity and/or to maintain the pressure of the coolant to the predetermined pressure inside the cooling loop 106 when there is no leakage of the coolant from the cooling loop 106. The coolant tank 210 may be a tank or reservoir containing a supply of the coolant. Additional details regarding the connection of the expansion tank 208 and the coolant tank 210 with the cooling loop 106 will be described in greater detail in the description below.

Furthermore, in some examples, the cooling system 204 may include a pressure transducer 232 to measure pressure at the pump inlet 116 (also referred to as inlet pressure) of the coolant circulation pump 114. Further, in some examples, the cooling system 204 may include a plurality of sensors 234A, 234B, 234C, 234D, 234E, and 234F (also referred to collectively as sensors 234A-234F) positioned at a multitude of locations within the cooling loop 106 to detect pressures, flow rates, temperatures, and levels of the coolant at the respective locations of the sensors 234A-234F. For example, the cooling system 104 may include one or more sensors 234A-234F in or at the pump inlet 116, the pump outlet 118, the coolant tank 210, the supply line 108, and the return line 110. In some examples, the detected pressures, flow rates, temperatures, and conductivity of the coolant may be indicative of a leak of coolant from the cooling loop 106. It may be noted that while the cooling system 204 is shown to include six sensors 234A-234F, less than six or more than six sensors may be used as well, within the scope of the present disclosure.

In some examples, the LM system 220 may reduce or eliminate spillage of the coolant at the site on the cooling loop 106 where the coolant leaked by controlling operations of the first valve unit 222, the second valve unit 224, the LM pump 128, and/or the coolant circulation pump 114. In some examples, the first valve unit 222 may include a first three-way valve 238 coupled between the collection tank 126 and the cooling loop 106, The first three-way valve 238 may include three fluid ports 240, 242, and 244 respectively coupled to the collection tank 126, the LM pump 128, and the cooling loop 106. Further, the second valve unit 224 may include a second three-way valve 246 and a third three-way valve 248 each including three fluid ports. The first three-way valve 238, the second valve unit 224, and the third three-way valve 248 are also referred to as three-way valves 238, 246, and 248. The second three-way valve 246 may include three fluid ports 250, 252, and 254; and the third three-way valve 248 may include three fluid ports 256, 258, and 260. The second three-way valve 246 may be coupled to the expansion tank 208 and the cooling loop 106. In particular, the fluid ports 250, 252, and 254 of the second three-way valve 246 are respectively coupled to the fluid port 260 of the third three-way valve 248, the cooling loop 106, and the expansion tank 208. Further, the third three-way valve 248 may be coupled to the coolant tank 210, the second three-way valve 246, and the LM pump 128. In particular, the fluid ports 256, 258, and 260 of the third three-way valve 248 are respectively coupled to the coolant tank 210, the LM pump, and the fluid port 250 of the second three-way valve 246. The LM pump 128 may be coupled between the third three-way valve 248 and the first three-way valve 238. In particular, the LM pump 128 may be coupled between the fluid ports 258 and 242 of the third three-way valve 248 and the first three-way valve 238, respectively.

Depending on a control signal received from the controller 130, the three-way valves 238, 246, or 248 may establish a fluid coupling between two of the respective three fluid ports. In some examples, each of the three-way valves 238, 246, or 248 may be operated in one of two states—a first state and a second state. The first three-way valve 238, when operated in the first state, may establish a fluid coupling between the fluid ports 242 and 244. Further, the first three-way valve 238, when operated in the second state, may establish fluid coupling between the fluid ports 240 and 242. The second three-way valve 246, when operated in the first state, may establish a fluid coupling between the fluid ports 252 and 254. Further, the second three-way valve 246, when operated in the second state, may establish fluid coupling between the fluid ports 252 and 250. The third three-way valve 248, when operated in the first state, may establish a fluid coupling between the fluid ports 256 and 258. Further, the third three-way valve 248, when operated in the second state, may establish fluid coupling between the fluid ports 258 and 260.

In some examples, the controller 130 may poll the pressure transducer 232 and/or the sensors 234A-234F to receive respective sensed parameters. By way of example, the pressure transducer 232 may sense instantaneous pressure at the pump inlet 116. Similarly, the sensors 234A-234F may sense parameters such as, but not limited to, pressure, flow rate, temperature, and/or conductivity of the coolant in the cooling loop 106 at respective locations. These sensed parameters may be indicative of the leak of coolant from the cooling loop 106. The controller 130 may then determine the existence of the leak of the coolant based on one or more of the pressure, flow rate, temperature, and/or conductivity of the coolant in the cooling loop 106. In particular, the controller 130 may compare measured values of these parameters with respective normal values and/or respective normal ranges. If the measured values of one or more of these parameters deviate from the respective normal values and/or respective normal ranges, the controller 130 may determine that there exists a leak in the cooling loop 106. The leak may occur at any position, for example, along one or more of the supply line 108, the cooling section 112, the return line 110, or any joints (fluid couplers not shown) in the cooling loop 106. It may be noted that the present disclosure is not limited with respect to techniques/methods for detecting the leak. Any suitable type of technique/method may be implemented to detect the leak of the coolant. Operation of the cooling system 204 in absence of the leakage of the coolant may be referred to as a normal operation of the cooling system 204.

During the normal operation of the cooling system 204, the controller 130 may continue to operate the coolant circulation pump 114 to enable a flow of the coolant inside the cooling loop 106. Further, in some examples, during the normal operation of the cooling system 204, the controller 130 may operate the second valve unit 224 such that the expansion tank 208 is fluidly coupled to the cooling loop 106. In particular, the controller 130 may operate the second three-way valve 246 in the first state so that a fluid coupling is established between the fluid ports 252 and 254 of the second three-way valve 246. When the expansion tank 208 is fluidly coupled with the cooling loop 106, the liquid-filled section 221 of the expansion tank 208 is fluidly coupled to the cooling loop 106, and thus is filled with coolant from the cooling loop 106 at a pressure equal to the inlet pressure for the coolant circulation pump 114. Accordingly, the gas in the gas-filled section 223 may compress or decompress based on the pressure of the coolant in the liquid-filled section 221. Therefore, the expansion tank 208 may absorb pressure changes at the pump inlet 116 and may thereby maintain the inlet pressure at (or near) the predetermined pressure. In some examples, the predetermined pressure may be about 14.7 psi (102.3 kPa). At such a pressure, pump cavitation may be prevented at the pump inlet 116.

Generally, during the normal operation of the cooling system 204, the three-way valves 238, 246, and 248 are operated in first states, and the LM pump 128 may be turned-off. However, if the inlet pressure (as measured using the pressure transducer 232) is determined to be less than a cut-off pressure, the controller 130 may enable the supply of additional coolant from the coolant tank 210 to the cooling loop 106. In certain examples, the cut-off pressure may represent a pressure indicative of a leakage of the coolant. At any time, in some examples, if the controller 130 determines that the pressure of the coolant inside the cooling loop 106 has dropped below the cut-off pressure, the controller 130 may determine that the coolant has leaked from the cooling loop 106.

In some examples, in response to the measured inlet pressure being less than the predetermined pressure but above the cut-off pressure, the controller 130 may activate the LM pump 128 to establish a fluid coupling between an outlet of the LM pump 128 and the cooling loop 106 via the first valve unit 222 and the second valve unit 224. In particular, the controller 130 may turn on the LM pump 128 and the three-way valves 238, 246, and 248 are operated in the first states. Accordingly, the LM pump 128 may draw the coolant from the coolant tank 210 via the third three-way valve 248 and supply the drawn coolant to cooling loop 106 via the first three-way valve 238 until the measured pressure reaches the predetermined pressure. Once the measured inlet pressure is substantially equal to the predetermined pressure, the LM pump 128 may be shutdown (e.g., powered off). Accordingly, the inlet pressure may be maintained at the predetermined pressure.

If the leakage of the coolant is detected, the controller 130 may operate the first valve unit 222, the second valve unit 224, and the LM pump 128 to transfer at least a portion of the coolant to the collection tank 126 from the cooling loop 106 via the second valve unit 224 and the first valve unit 222. In particular, to transfer at least the portion of the coolant to the collection tank 126 from the cooling loop 106, the controller 130 may send control signals to the three-way valves 238, 246, and 248 to operate the three-way valves 238, 246, and 248 in the second states so that a fluid coupling between the cooling loop 106 and the collection tank 126 is established. Also, in the event of the leakage of the coolant, the controller 130 may turn on the LM pump 128 so that some of the coolant may be transferred to the collection tank 126 from the cooling loop 106, In particular, the LM pump 128 when turned on, may create a suction force that draws the coolant from the cooling loop 106 via the three-way valves 246 and 248. The LM pump 128 may then supply the drawn coolant to the collection tank 126. The transfer of some of the coolant from the cooling loop 106 to the collection tank 126 may reduce the pressure of the coolant remaining inside the cooling loop 106 to slightly below atmospheric pressure, which prevents additional liquid from leaving the cooling loop 106.

Further, in some examples, in the event of the leak, the controller 130 may suspend the operation of the coolant circulation pump 114 by cutting-down a power supply to the coolant circulation pump 114 to stop the circulation of the coolant through the cooling loop 106. Furthermore, in some examples, in the event of the leak, the controller 130 may isolate the expansion tank 208 from the cooling loop 106, In particular, when the second three-way valve 246 is operated in the second state, the fluid coupling between the expansion tank 208 and the cooling loop 106 may be discontinued, and the expansion tank 208 is said to be isolated from the cooling loop 106. Moreover, when the third three-way valve 248 is operated in the second state, the coolant tank 210 may no longer be fluidly coupled to the cooling loop 106. Due to the isolation of the coolant tank 210 from the cooling loop 106, no additional coolant may be supplied to the cooling loop 106 in the event of the leak. Advantageously, the shutdown of the coolant circulation pump 114, and the isolation of the expansion tank 208 and the coolant tank 210 from the cooling loop 106, may reduce the pressure in the cooling loop 106 thereby stopping the spillage of the coolant from the cooling loop 106 to the surrounding environment at the location of the leak.

Figure 3:
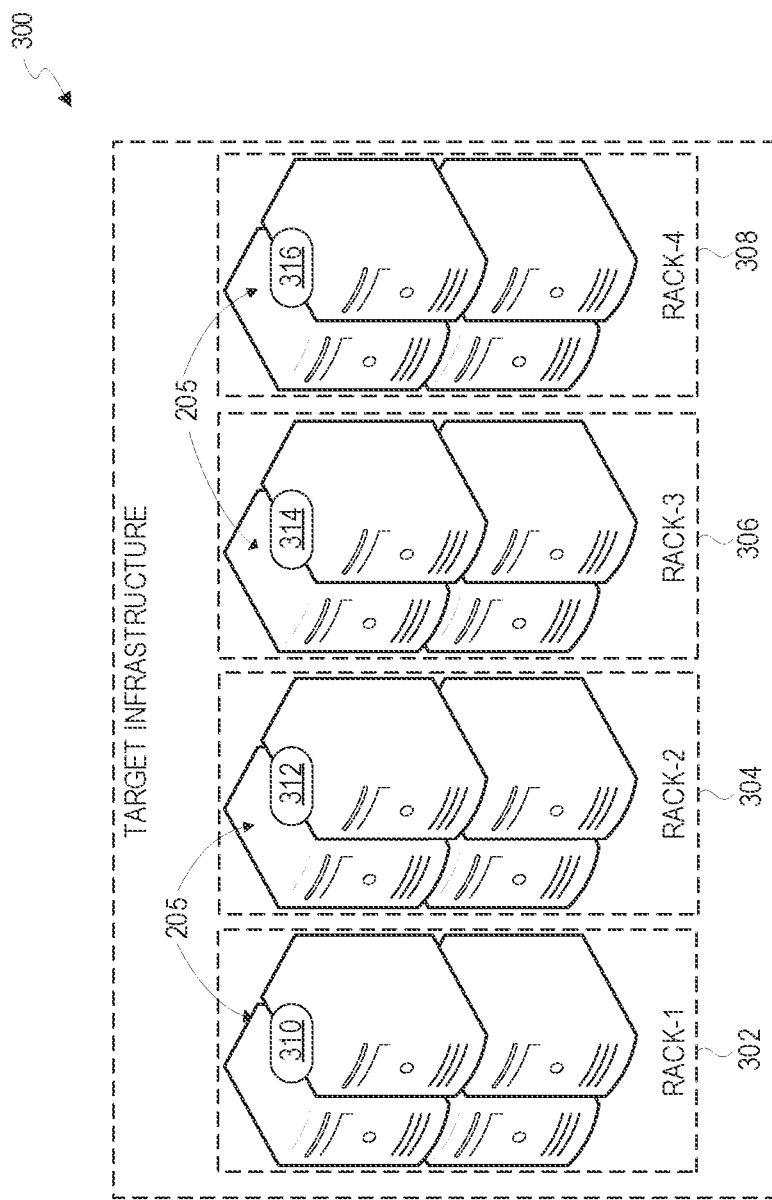
FIG. 3 is a block diagram of computing infrastructure, in accordance with an example.

Referring now to FIG. 3, a block diagram of a target infrastructure 300 is presented, in accordance with one example of the present disclosure. The target infrastructure 300 of FIG. 3 may represent one example of the target infrastructures 102 or 202 implemented in FIGS. 1-2. In particular, in the target infrastructure 300, the computing devices 205 are shown as disposed in a plurality of racks 302, 304, 306, and 308. Although only four racks are shown in the target infrastructure 300 depicted in FIG. 3, use of more or fewer racks than depicted is also envisioned. Further, for ease of illustration, cooling networks of the cooling loop 106 are not shown in FIG. 3. Also, in order to eliminate the complexity of illustration in FIG. 3, these racks 302-308 are simply marked using dashed boxes. The racks 302-308 may be arranged in rows of, for example, roughly 10-30 units, with access doors (not shown) on each side of the racks 302-308. Moreover, access aisles (not shown) are provided on both sides of the rows so that an operator may approach the access doors on each side. In some examples, the racks 302-308 may include sliders (not shown) on which the computing devices 205 may be mounted via mounting fixtures.

A plurality of computing devices, such as the computing devices 205, may be supported in a single stack in each rack 302-308. The racks 302-308 may include a rack assembly having a front door and a back door. Each of the computing devices 205 may include a chassis (not shown) having a main board and other components, such as one or more power supplies, hard drives, processors, expansion cards, contained within the chassis. In some implementations, the front door of the rack assembly provides access to the front sides of the computing devices 205 and the back door provides access to the backsides, where the I/O ports for the computing devices are typically provided.

Additionally, in some implementations, the target infrastructure 300 may include distributed tanks that may collectively replace a common tank such as the collection tank 126. For example, in the implementation of FIG. 3, the distributed tanks may include a plurality of tanks 310, 312, 314, 316 that are disposed in the racks 302-308. The collection tanks 310-316 may be representative of the collection tank 126. A collection tank such as the collection tanks 310-316 may be disposed in each rack 302-308 as shown in FIG. 3. The collection tanks 310-316 may be sized such that the collection tanks 310-316 may be able to prevent the spill of the coolant in the respective rack. It is understood that fluid coupling of the collection tanks 310-316 with the cooling loop 106 may be controlled using respective valves (not shown) under the control of the controller 130.

Figure 4:
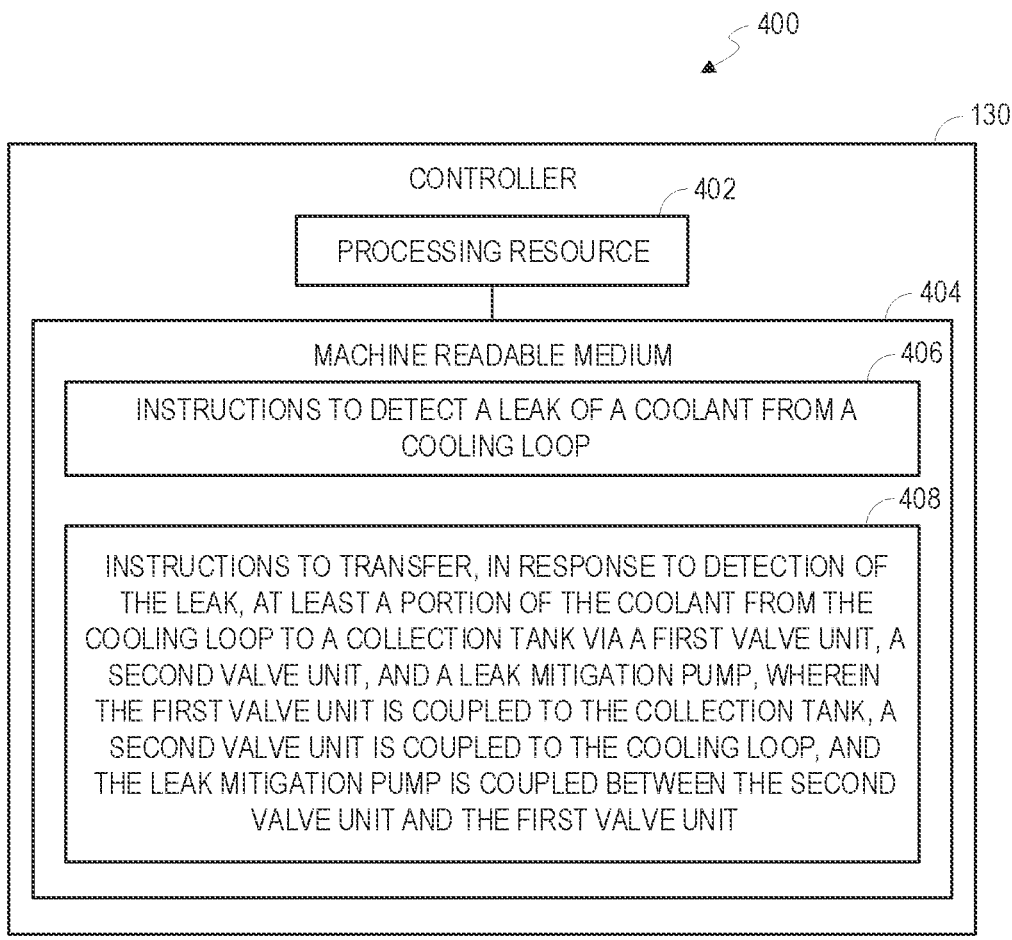
FIG. 4 is a block diagram of a controller used in a leak mitigation system, in accordance with an example.

Turning now to FIG. 4, a block diagram 400 of the controller 130 is presented, in accordance with one example. In some examples, the controller 130 may include a processing resource 402 and a machine-readable medium 404. The machine-readable medium 404 may be any electronic, magnetic, optical, or other physical storage device that may store data and/or executable instructions 406 and 408. For example, the machine-readable medium 404 may include one or more of a RAM, an EEPROM, a storage drive, a flash memory, a Compact Disc Read-Only Memory (CD-ROM), or the like. The machine-readable medium 404 may be a non-transitory machine-readable medium. As described in detail herein, the machine-readable medium 404 may be encoded with the executable instructions 406, 408 to perform operations at one or more blocks of the method described in FIGS. 5-6.

Further, the processing resource 402 may be a physical device, for example, one or more central processing units (CPUs), one or more semiconductor-based microprocessors, microcontrollers, one or more graphics processing units (GPUs), an application-specific integrated circuit (ASIC), a field-programmable gate array (FPGA), other hardware devices capable of retrieving and executing instructions 406, 408 stored in the machine-readable medium 404, or combinations thereof. The processing resource 402 may fetch, decode, and execute the instructions 406, 408 stored in the machine-readable medium 404 to reduce spillage of the coolant in the event of the leak. As an alternative or in addition to executing the instructions 406, 408, the processing resource 402 may include at least one integrated circuit (IC), control logic, electronic circuits, or combinations thereof that include a number of electronic components for performing the functionalities intended to be performed by the controller 130.

In some examples, the instructions 406 when executed by the processing resource 402 may cause the processing resource 402 to detect a leak of the coolant from a cooling loop such as the cooling loop 106, The cooling loop 106 facilitates a flow of the coolant to cool one or more heat-generating components in a target infrastructure, for example, the target infrastructure 102 or 202. Further, in some examples, the instructions 408 when executed by the processing resource 402 may cause the processing resource 402 to transfer at least a portion of the coolant from the cooling loop 106 to the collection tank 126 via a first valve unit (e.g., the first valve unit 122, 222), a second valve unit (e.g., the second valve unit 124, 224), and an LM pump (e.g., the LM pump 128). Although not shown in FIG. 4, the machine-readable medium 404, in some examples, may include instructions to perform one or more operations described in the method of FIG. 6.

Figure 5:
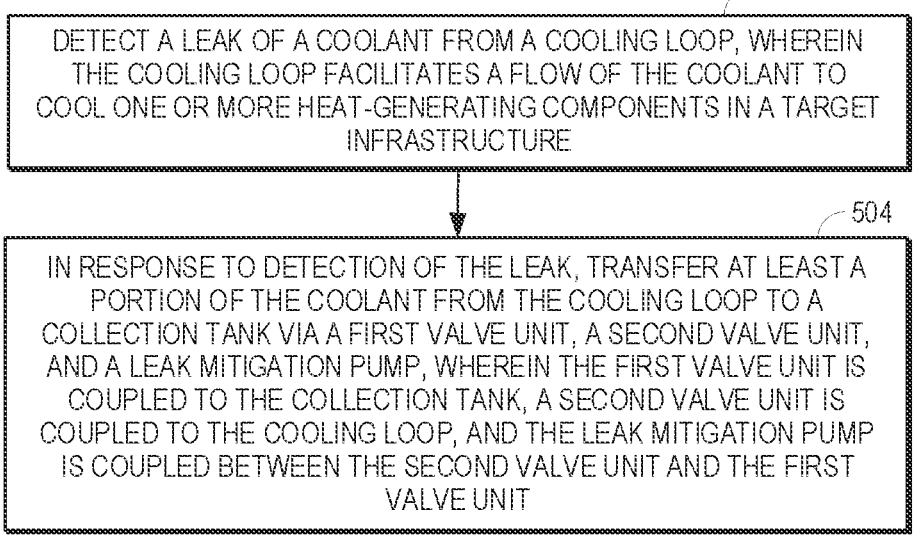
FIG. 5 is a flow diagram of a method for mitigating a leak of a coolant, in accordance with an example.
Figure 6:
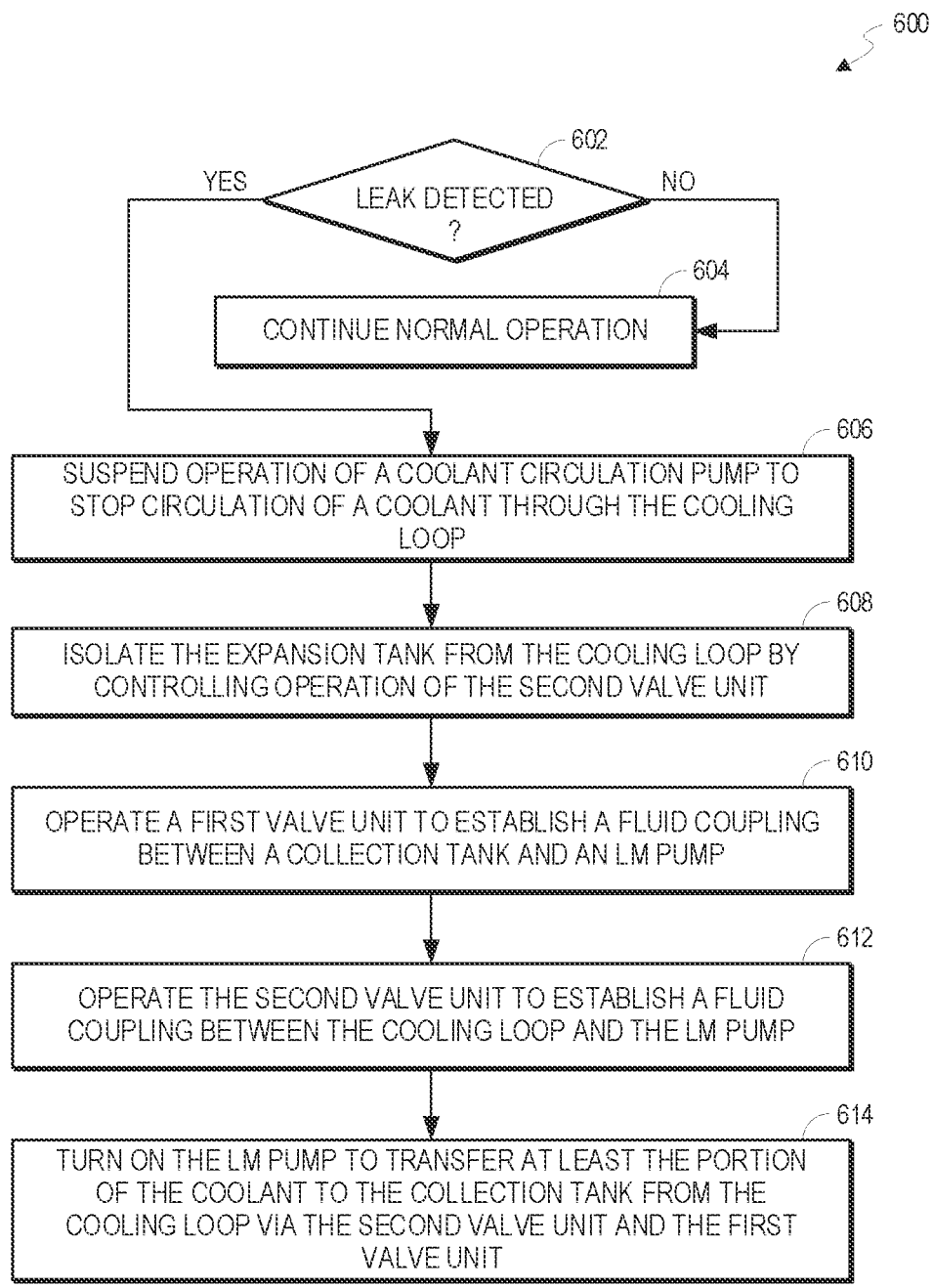
FIG. 6 is a flow diagram of a method for mitigating a leak of a coolant, in accordance with another example.

In the description hereinafter, several operations performed by the controller 130 will be described with help of flow diagrams depicted in FIGS. 5 and 6. For illustration purposes, the flow diagrams, depicted in FIGS. 5 and 6, are described in conjunction with the cooling systems 104 and 204 depicted in FIGS. 1-2, however, the methods of FIGS. 5 and 6 should not be construed to be limited to the example configurations of the systems 104 and 204. The methods described in FIGS. 5 and 6 include a plurality of blocks, at which operations may be performed by a processor-based system such as, for example, the controller 130. In particular, operations at each of the plurality of blocks may be performed by a processing resource such as the processing resource 402 by executing one or more of the instructions 406, 408 stored in the machine-readable medium 404. In particular, the methods described in FIGS. 5 and 6 may represent an example logical flow of some of the several operations performed by the controller 130. However, in some other examples, the order of execution of the blocks depicted in FIGS. 5 and 6 may be different than the order shown. For example, the operations at various blocks may be performed in series, in parallel, or in a series-parallel combination.

Referring now to FIG. 5, a flow diagram of a method 500 for mitigating a leak of a coolant is presented, in accordance with an example. The method 500 may include blocks 502 and 504 that are performed by the controller 130, in one example. In certain examples, operations at blocks 502 and 504 may be performed by the processing resource 402 by executing one or more of the instructions 406, 408 stored in the machine-readable medium 404. Certain details of operations performed at blocks 502, 504 have been described in conjunction with FIGS. 1-2 which are not repeated herein for sake of brevity.

At block 502, the controller 130 may detect a leak of the coolant from the cooling loop 106 that facilitates a flow of the coolant to cool one or more heat-generating components in the target infrastructure (e.g., the target infrastructure 102, 202). As noted earlier, various parameters such as pressure, flow rate, temperature, and/or conductivity of the coolant in the cooling loop 106 may be indicative of the leak of coolant from the cooling loop 106. Therefore, in some implementations, the controller 130 may monitor such parameters via one or more sensors/transducers (see FIGS. 2-3). The controller 130 may then determine the existence of the leak of the coolant by comparing measured values of these parameters with respective normal values and/or respective normal ranges. If the measured values of one or more of these parameters deviates from the respective normal values and/or respective normal ranges, the controller 130 may determine that there exists a leak in the cooling loop 106, The leak may occur at any position, for example, the supply line 108, the cooling section 112, the return line 110, or any joints (fluid couplers—not shown) in the cooling loop 106. It may be noted that the present disclosure is not limited with respect to techniques or methods for detecting the leak. Any suitable type of technique or method may be implemented to detect the leak of the coolant.

Further, at block 504, the controller 130 may transfer at least a portion of the coolant from the cooling loop 106 to the collection tank 126 via a first valve unit (e.g., the first valve unit 122, 222), a second valve unit (e.g., the second valve unit 124, 224), and an LM pump (e.g., the LM pump 128). Additional details regarding the operation of the first valve unit, the second valve unit, and the LM pump to enable the transfer of the coolant and certain other additional operations performed by the controller 130 are described in conjunction with the method of FIG. 6.

Turning now to FIG. 6, a detailed method 600 for mitigating a leak of a coolant is presented, in accordance with an example. The method 600 may include blocks 602, 604, 606, 608, 610, 612, and 614 (hereinafter collectively referred to as blocks 602-614) that are performed by the controller 130, in one example. In certain examples, operations at blocks 602-614 may be performed by the processing resource 402 by executing one or more of the instructions 406, 408 and/or any additional instructions stored in the machine-readable medium 404. For illustration purposes, the method 600 of FIG. 6 is described in conjunction with the system 200 of FIG. 2.

At block 602, the controller 130 may perform a check to detect the leak in the cooling loop 106. In general, the operations that may be performed by the controller 130 at block 602 to detect the leak have already been described in block 502 of FIG. 5. At block 602, if it is determined that there exists no leak, normal operation of the cooling system, such as, the cooling system 204 continues as indicated by block 604. In some examples, during the normal operation of the cooling system 204, the coolant circulation pump 114 may drive the flow of the coolant inside the cooling loop 106 and the expansion tank 208 may be fluidly coupled to the cooling loop 106 to maintain the coolant at the predetermined pressure inside the cooling loop 106. However, if the leakage of the coolant is detected at block 602, the controller 130, at block 606 may suspend the operation of the coolant circulation pump 114 to stop the circulation of the coolant through the cooling loop 106. Further, at block 608, the controller 130 may isolate the expansion tank 208 from the cooling loop 106 by controlling the operation of the second valve unit 224. In particular, to isolate the expansion tank 208 from the cooling loop 106 the controller may communicate a control signal to the second three-way valve 246 to operate the second three-way valve 246 in the second state.

Further, at block 610, the controller 130 may operate the first valve unit 222 to establish a fluid coupling between the collection tank 126 and the leak mitigation pump 128. In some examples, to establish the fluid coupling between the collection tank 126 and the leak mitigation pump 128, the controller 130 may communicate a control signal to the first three-way valve 238 so that a fluid path between the collection tank 126 and the leak mitigation pump 128 is established via the first three-way valve 238, In particular, at block 610, the controller 130 may operate the first three-way valve 238 of the first valve unit 222 in the second state.

Furthermore, at block 612, the controller 130 may operate the second valve unit 224 to establish a fluid coupling between the cooling loop 106 and the leak mitigation pump 128. In some examples, to establish the fluid coupling between the cooling loop 106 and the leak mitigation pump 128, the controller 130 may communicate control signals to the second three-way valve 246 and the third three-way valve 248 so that a fluid path between the cooling loop 106 and the leak mitigation pump 128 is established via the second three-way valve 246 and the third three-way valve 248. In particular, at block 612, the controller 130 may operate the second three-way valve 246 and the third three-way valve 248 in the second states. In some examples, when the third three-way valve 248 is operated in the second state, the coolant tank 210 may be isolated from the cooling loop 106.

Moreover, at block 614, the controller 130 may turn on the LM pump 128 to transfer at least the portion of the coolant to the collection tank 126 from the cooling loop 106 via the second valve unit 224 and the first valve unit 222. In particular, the controller 130 may turn on the LM pump 128 by enabling the supply of the electrical power to the LM pump 128. The LM pump 128, when operated, creates a suction force at its inlet. The suction force created by the LM pump 128 may cause the transfer of at least a portion of the coolant from the cooling loop 106 to the collection tank 126 via the second valve unit 224 and the first valve unit 222. Such transfer of the coolant from the cooling loop 106 to the collection tank 126 advantageously reduces or eliminates an outflow of the coolant from the cooling loop 106 at the location of the leak.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. A leak mitigation system, comprising:
a collection tank;
a first valve unit coupled to the collection tank;
a second valve unit coupled to a cooling loop carrying a coolant;
a leak mitigation pump coupled between the first valve unit and the second valve unit; and
a controller operatively coupled to the first valve unit; the second valve unit, and the leak mitigation pump to operate, in an event of a leak of the coolant from the cooling loop, the first valve unit, the second valve unit, and the leak mitigation pump to transfer at least a portion of the coolant to the collection tank from the cooling loop via the second valve unit and the first valve unit.

2. The leak mitigation system of claim 1, wherein the cooling loop comprises a cooling section disposed in thermal contact with one or more computing devices to cool one or more heat-generating components in the one or more computing devices.

3. The leak mitigation system of claim 1, wherein the cooling loop comprises a coolant circulation pump to circulate the coolant inside the cooling loop.

4. The leak mitigation system of claim 3, wherein the controller is to:
detect the leak of the coolant from the cooling loop;
in response to detection of the leak,
suspend operation of the coolant circulation pump to stop circulation of the coolant through the cooling loop;
operate the first valve unit to establish a fluid coupling between the collection tank and the leak mitigation pump;
operate the second valve unit to establish a fluid coupling between the cooling loop and the leak mitigation pump; and
turn on the leak mitigation pump to transfer at least the portion of the coolant to the collection tank from the cooling loop via the second valve unit and the first valve unit.

5. The leak mitigation system of claim 1, wherein the first valve unit comprises a first three-way valve coupled between the collection tank and the cooling loop.

6. The leak mitigation system of claim 1, wherein the second valve unit is coupled between an expansion tank and the cooling loop, wherein the controller operates the second valve unit to fluidly couple the expansion tank to the cooling loop to maintain the coolant at a predetermined pressure inside the cooling loop when there is no leakage of the coolant from the cooling loop.

7. The leak mitigation system of claim 6, wherein the controller operates the second valve unit to isolate the expansion tank from the cooling loop in the event of the leak of the coolant from the cooling loop.

8. The leak mitigation system of claim 6, wherein the first valve unit and the second valve unit are coupled to a coolant tank, wherein the controller operates the first valve unit and the second valve unit to fluidly couple the coolant tank to the cooling loop to maintain a predetermined quantity of the coolant inside the cooling loop when there is no leakage of the coolant from the cooling loop.

9. The leak mitigation system of claim 8, wherein the second valve unit comprises:
a second three-way valve coupled to the expansion tank and the cooling loop; and
a third three-way valve coupled to the coolant tank, the second three-way valve, and the leak mitigation pump.

10. A method comprising:
detecting, by a controller, a leak of a coolant from a cooling loop, wherein the cooling loop facilitates a flow of the coolant to cool one or more heat-generating components in a target infrastructure; and
in response to detection of the leak, transferring, by the controller, at least a portion of the coolant from the cooling loop to a collection tank via a first valve unit, a second valve unit, and a leak mitigation pump, wherein the first valve unit is coupled to the collection tank, a second valve unit is coupled to the cooling loop, and the leak mitigation pump is coupled between the second valve unit and the first valve unit.

11. The method of claim 10, wherein transferring at least a portion of the coolant from the cooling loop to the collection tank comprises operating the first valve unit to establish a fluid coupling between the collection tank and the leak mitigation pump.

12. The method of claim 11, wherein the first valve Unit comprises a first three-way valve coupled between the collection tank and the cooling loop, and wherein operating the first valve unit to establish a fluid coupling between the collection tank and the leak mitigation pump comprises communicating a control signal to the first three-way valve to establish the fluid coupling between the collection tank and the leak mitigation pump via the first three-way valve.

13. The method of claim 10, wherein transferring at least a portion of the coolant from the cooling loop to the collection tank comprises operating the second valve unit to establish a fluid coupling between the cooling loop and the leak mitigation pump.

14. The method of claim 13, wherein the second valve unit comprises a second three-way valve coupled to an expansion tank and the cooling loop and a third three-way valve coupled between the second three-way valve and the leak mitigation pump, and wherein operating the second valve unit to establish the fluid coupling between the cooling loop and the leak mitigation pump comprises communicating control signals to the second three-way valve and the third three-way valve to establish the fluid coupling between the collection tank and the leak mitigation pump via the second three-way valve and the third three-way valve.

15. The method of claim 14, further comprising isolating, by the controller, the expansion tank from the cooling loop by controlling the second three-way valve.

16. The method of claim 10, wherein transferring at least a portion of the coolant from the cooling loop to the collection tank comprises turning on the leak mitigation pump to transfer at least the portion of the coolant to the collection tank from the cooling loop via the second valve unit and the first valve unit.

17. The method of claim 10, further comprising suspending, in response to detection of the leak, operation of a coolant circulation pump to stop circulation of the coolant through the cooling loop, wherein the coolant circulation pump is disposed along the cooling loop.

18. A non-transitory machine-readable medium storing instructions executable by a processing resource, the instructions comprising:
- instructions to detect a leak of a coolant from a cooling loop, wherein the cooling loop facilitates a flow of the coolant to cool one or more heat-generating components in a target infrastructure; and
- instructions to transfer, in response to detection of the leak, at least a portion of the coolant from the cooling loop to a collection tank via a first valve unit, a second valve unit, and a leak mitigation pump, wherein the first valve unit is coupled to the collection tank, the second valve unit is coupled to the cooling loop, and the leak mitigation pump is coupled between the second valve unit and the first valve unit.

19. The non-transitory machine-readable medium of claim 18, further comprising instructions to suspend, in response to detection of the leak, operation of a coolant circulation pump to stop circulation of the coolant through the cooling loop, wherein the coolant circulation pump is disposed along the cooling loop.

20. The non-transitory machine-readable medium of claim 18, wherein the instructions to transfer at least the portion of the coolant from the cooling loop to the collection tank comprises:
- instructions to operate the first valve unit to establish a fluid coupling between the collection tank and the leak mitigation pump;
- instructions to operate the second valve unit to establish a fluid coupling between the cooling loop and the leak mitigation pump; and
- instructions to turn on the leak mitigation pump to transfer at least the portion of the coolant to the collection tank from the cooling loop via the second valve unit and the first valve unit.

* * * * *